(12) United States Patent
Riehl et al.

(10) Patent No.: US 6,366,194 B1
(45) Date of Patent: *Apr. 2, 2002

(54) COMPONENT HOLDER FOR A HALL SENSOR AND PROCESS FOR MANUFACTURING A COMPONENT HOLDER

(75) Inventors: Guenther Riehl; Martin Hager, both of Buehlertal (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/355,500
(22) PCT Filed: Jul. 29, 1998
(86) PCT No.: PCT/DE98/02142
§ 371 Date: Sep. 20, 1999
§ 102(e) Date: Sep. 20, 1999
(87) PCT Pub. No.: WO99/25034
PCT Pub. Date: May 20, 1999

(30) Foreign Application Priority Data

Nov. 6, 1997 (DE) .......................... 197 48 982

(51) Int. Cl.[7] .............................. H01L 43/00
(52) U.S. Cl. .................... 338/32 H; 338/221; 338/315; 338/325; 361/811; 361/813
(58) Field of Search ................. 338/32 H, 275, 338/276, 325, 315, 220, 221; 361/742, 807, 808, 811, 813

(56) References Cited

U.S. PATENT DOCUMENTS

| 2,966,618 A | * | 12/1960 | Lehner | 361/807 |
|---|---|---|---|---|
| 4,061,988 A | * | 12/1977 | Lewandowski | 338/32 H |
| 4,156,820 A | * | 5/1979 | Fukuda et al. | 338/32 H |
| 4,322,709 A | * | 3/1982 | Vonder et al. | 338/32 H |
| 4,340,877 A | * | 7/1982 | Herden | 338/32 H |
| 4,600,971 A | * | 7/1986 | Rose et al. | 361/742 |
| 4,631,639 A | * | 12/1986 | Biraud | 361/742 |
| 5,439,275 A | * | 8/1995 | Padula et al. | 338/32 H |
| 5,612,855 A | * | 3/1997 | Heeb et al. | 361/807 |

* cited by examiner

Primary Examiner—Karl D. Easthom
(74) Attorney, Agent, or Firm—Ronald E. Greigg

(57) ABSTRACT

Known Hall sensors are fastened to a printed circuit board by way of component holders in order to achieve an exact positioning and securing on a printed circuit board in relation to a magnet ring of a rotor of an adjusting motor. A component holder for a Hall sensor is partially injection molded only onto connecting prongs of the Hall sensor or is injection molded onto connecting prongs and at least partially onto a housing of the Hall sensor. The component holder for a Hall sensor according to the invention is provided for adjusting motors, such as window regulator motors of motor vehicles.

8 Claims, 5 Drawing Sheets

COMPONENT HOLDER FOR A HALL SENSOR AND PROCESS FOR MANUFACTURING A COMPONENT HOLDER

PRIOR ART

The invention is based on a component holder for a Hall sensor and on a process for manufacturing a component holder A component holder for a Hall sensor is already known (German Patent Disclosure 32 35 204), which is placed over the Hall sensor in order to hold it in all directions so that it is possible to position the Hall sensor on a printed circuit board in a narrow radial tolerance range in relation to a circumferential magnet ring. The component holder has injection molded centering pins which can be inserted into corresponding openings of the printed circuit board. In order to mount the Hall sensor, its connecting prongs are first slid into openings of the printed circuit board and then the component holder is placed over the Hall sensor until the component holder, with its underside, comes into contact with the surface of the printed circuit board. However, this type of mounting of the Hall sensor and component holder on the printed circuit board is costly. In addition, the superposition of the component holder does not permit a play-free seating of the Hall sensor in the component holder. Without a play-free seating, though, it is very difficult to determine with a high degree of precision the rotational position of a rotor to be detected that belongs to an adjusting motor. Furthermore, the component holder known from the prior art is not suited for an automatic placement in mass production by means of automatic placement machines.

ADVANTAGES OF THE INVENTION

The component holder according to the invention, as well as the process for manufacturing a component holder has the advantage over the prior art that a play-free connection of the Hall sensor in the component holder occurs, by means of which the Hall sensor can be fastened to a printed circuit board with a high degree of precision in relation to a magnet ring. It is also particularly advantageous that the component holder according to the invention permits an automatic placement of the printed circuit board by means of automatic placement machines in mass production so that assembly costs are reduced.

Advantageous improvements and updates of the component holder disclosed herein, as well as of the process disclosed, are possible by means of the measures taken as set forth hereinafter.

BRIEF DESCRIPTION OF THE DRAWINGS

Exemplary embodiments of the invention are depicted in simplified fashion in the drawings and will be explained in detail in the description below.

DESCRIPTION THE EXEMPLARY EMBODIMENTS

Figure 1:
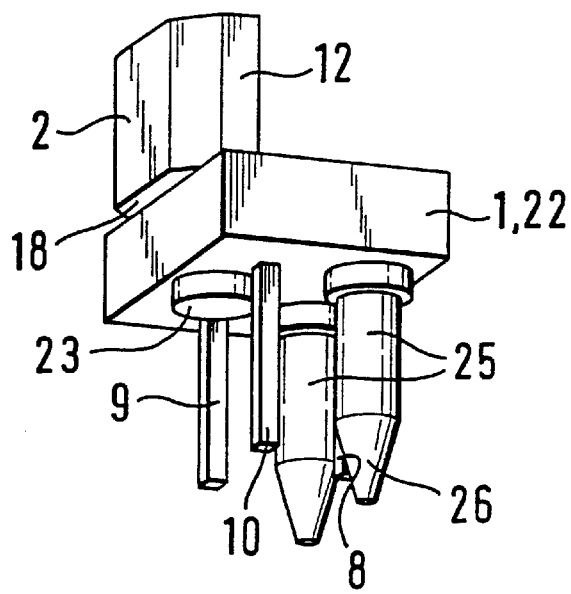
FIG. 1 is a perspective depiction of a component holder with a Hall sensor in accordance with a first exemplary embodiment according to the invention.

FIG. 1 is a perspective representation of a component holder 1 with a Hall sensor 2 according to a first exemplary embodiment according to the invention. For example, the Hall sensor 2 is used in a known manner for position detection of the rotational position of a rotor 5 that is indicated with dashed lines in FIGS. 3, 4, and 9. The rotor 5 is a component of an adjusting motor, not shown in detail, of the kind that is used, for example, for window regulator motors or as a sunroof drive mechanism for motor vehicles. Distributed on its circumference, the rotor 5 has magnet rings, not shown in detail, which preferably have multi-poled, permanently magnetized regions. The rotational position of the rotor 5 can be determined in a known manner in the cooperation of the magnetized regions of the rotor 5 with the Hall sensor.2.

Hall sensors 2 of this kind have an essentially block-shaped housing 12. As shown in FIG. 5, a bottom view of the component holder 1 with Hall sensor 2, the Hall sensor 2 has three connecting prongs 8, 9, 10 that. The connecting prongs 8, 9, 10 protrude from the housing 12 of the Hall sensor 2 essentially at right angles and then extend more or less sharply angled, partially offset to a sensor side 3 of the Hall sensor 2 oriented toward the rotor 5, and continuing from this sensor side 3, for example as shown in detail in FIG. 3, a section through the component holder 1 with Hall sensor 2 along a line III—III in FIG. 2, which is a front view of the Hall sensor 2 with component holder 1. As also shown in FIG. 4, a section through the component holder 1 with Hall sensor 2 along a line IV—IV in FIG. 2, the connecting prongs 8, 9, 10 provided for the electrical connection to a printed circuit board 15 are embedded in their angled region in the component holder 1 that is comprised of plastic. The component holder 1 is essentially comprised of a part 22 that is embodied as block-shaped and extends from an underside 18 of the Hall sensor 2, which is oriented toward the printed circuit board 15, to the vicinity of a surface 20 of the printed circuit board 15. Another part 23 on the component holder 1—which part can be seen in FIGS. 1, 3, and 5, is embodied of one piece with the component holder 1, and is embodied for example as cylindrical—is used as a spacer, which rests against the surface 20 of the printed circuit board 15 when the component holder 1 is in the mounted state.

Figure 5:
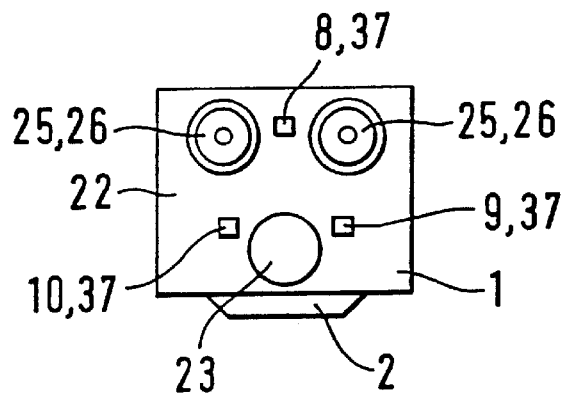
FIG. 5 is a bottom view of the component holder with Hall sensor according to the invention.
Figure 6:
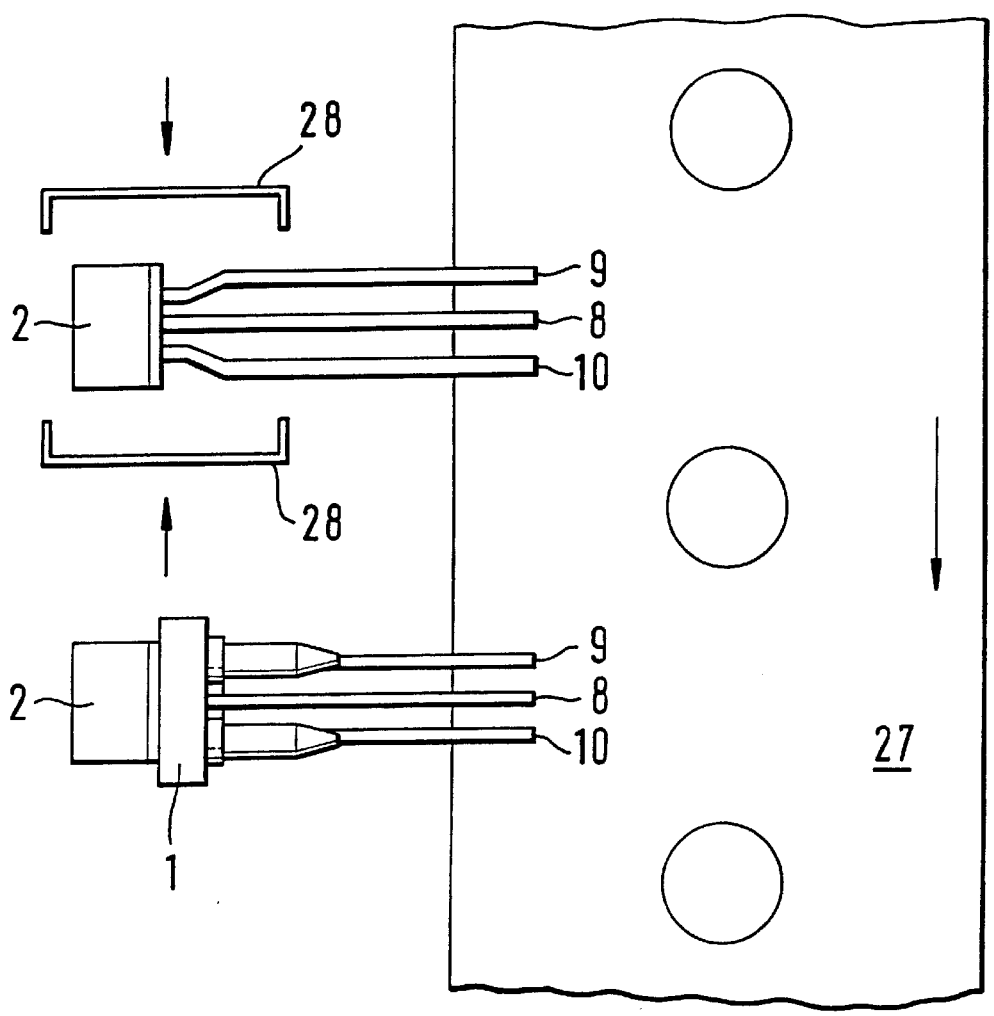
FIG. 6 shows a detail of a belt loaded with a Hall sensor with and without the component holder according to the invention.
Figure 7:
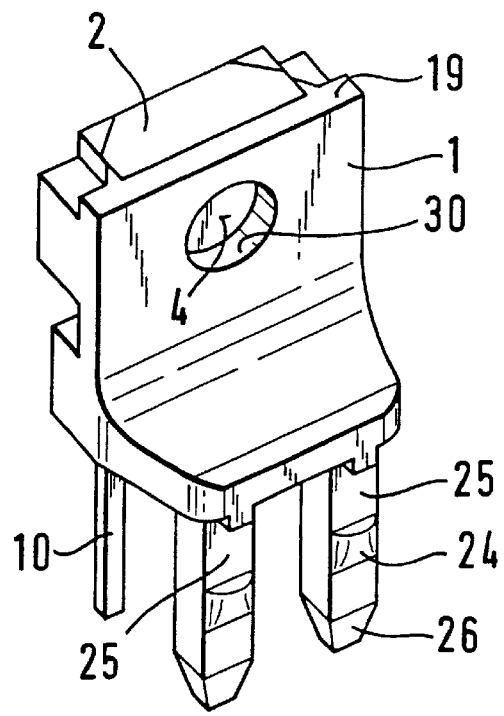
FIG. 7 is a perspective depiction of the component holder with Hall sensor according to a second exemplary embodiment according to the invention.
Figure 8:
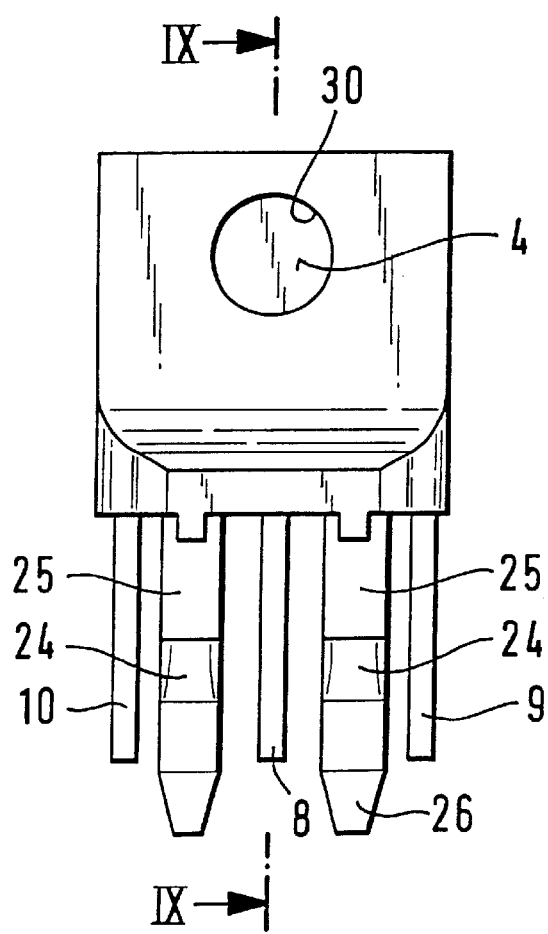
FIG. 8 is a front view of the component holder with Hall sensor according to the invention in accordance with FIG. 7.

The component holder 1 is injection molded onto the connecting prongs 8, 9, 10 by means of injection molding tools 28 indicated in FIG. 6, which for this purpose encompass the Hall sensor 2 on the housing 12 and in the vicinity of the connecting prongs 8, 9, 10 close to the housing. As shown in detail in FIG. 4, for example two cylindrically embodied centering pins 25 with conically tapering ends 26 are provided on the block-shaped part 22 of the component holder 1. The centering pins 25 protrude from the block-shaped part 22 of the component holder 1 approximately at right angles. The connecting prongs 8, 9, 10 have a first section 35, which protrudes at approximately right angles from the underside 18 of the Hall sensor 2 and transitions into a second section 36, which extends parallel to the surface 20 of the printed circuit board 15 or at a slight incline in relation to the surface 20, and then finally transitions into an end section 37, which extends approximately parallel to the centering pins 25 and lateral to the surface 20 of the printed circuit board 15. Preferably, the sections 35 and 36 are completely bonded into the plastic of the component holder 1 and the end section 37 is only partially bonded into it. The centering pins 25 extend slightly longer lateral to the surface 20 of the printed circuit board 15 than the connecting prongs 8, 9, 10. The connecting prong 8 extends between the two centering pins 25 and, as shown in FIG. 5, for example forms a triangle with the two other connecting prongs 8, 9, 10 and represents the apex of this triangle.

Figure 2:
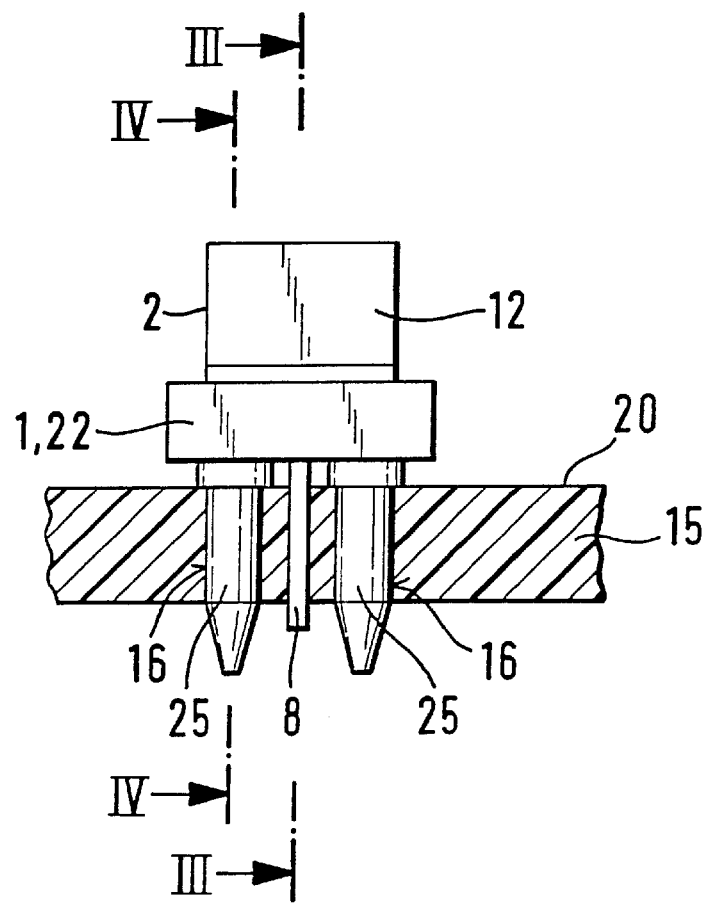
FIG. 2 is a front view of the component holder with Hall sensor according to the invention in accordance with FIG. 1.
Figure 3:
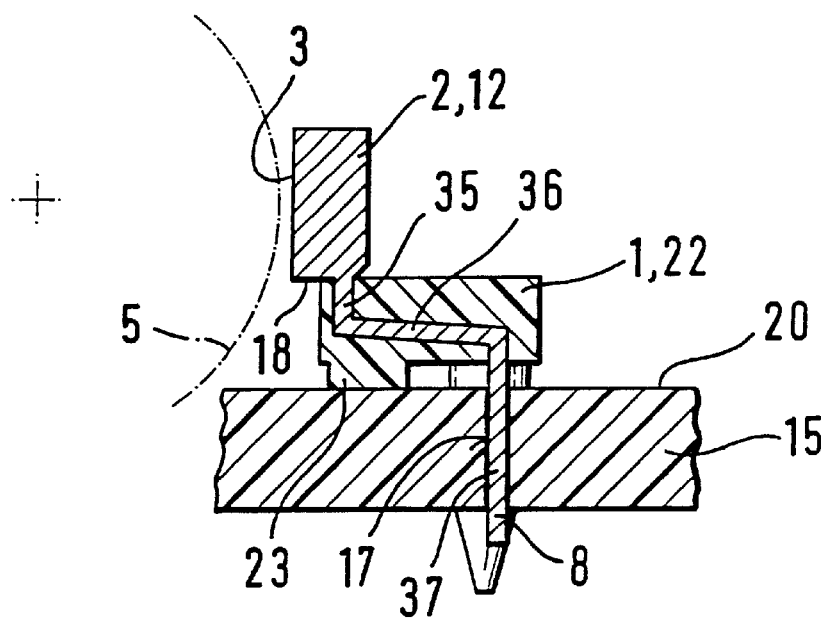
FIG. 3 is a section through the component holder with Hall sensor according to the invention along a line III—III in FIG. 2.
Figure 4:
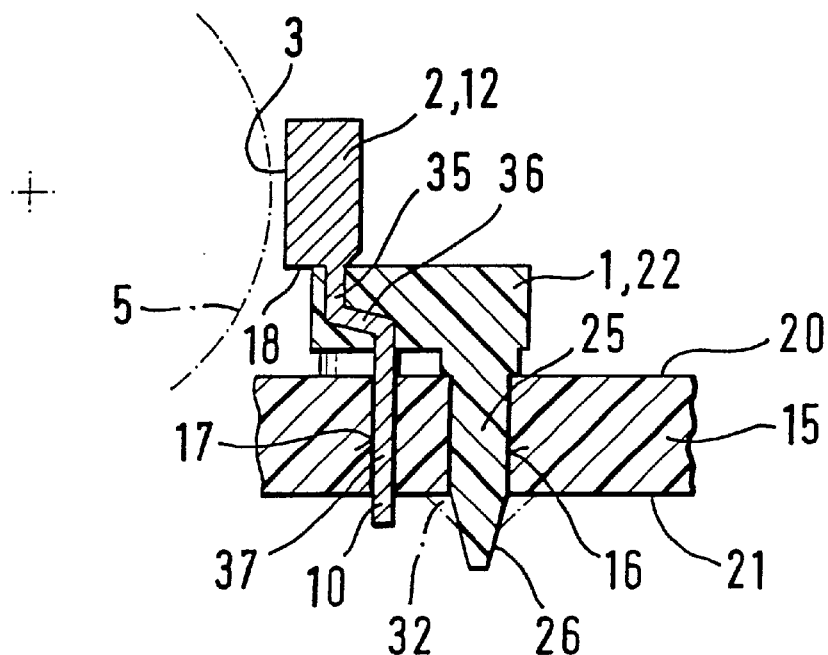
FIG. 4 is a section through the component holder with Hall sensor according to the invention along a line IV—IV in FIG. 2.

The centering pins 25 are used on the one hand for exactly positioning the Hall sensor 2 on the printed circuit board 15 shown in FIGS. 2, 3, and 4, and on the other hand for securing the component holder 1 with the Hall sensor 2 to the printed circuit board 15. As shown in detail in FIG. 4, the printed circuit board 15 has corresponding openings 16 for receiving the centering pins 25 as well as three other openings 17 for receiving the connecting prongs 8, 9, 10.

As shown in FIG. 6, the injection molding of the component holder 1 can for example be carried out in such a way that at first, the Hall sensor 2, without a component holder 1, is situated with its connecting prongs 8, 9, 10 on a belt 27. Belts 27 of this kind, which are loaded with a multitude of Hall sensors 2, are usually provided in mass production in automatic placement machines in order to affix the electrical components attached to the belts 27 to the printed circuit board 15 by way of mounting means that are not shown in detail. By means of the injection molding tools 28 indicated in FIG. 6, the component holder 1 can simply be injection molded onto the Hall sensors 2 fastened to the belt 27 so that the placement onto the printed circuit board 15 can take place in another step of the process by way of mounting means that are not shown in detail. It is also conceivable, however, to injection mold the component holder 1 without the belt 27 onto the Hall sensor 2 in order to permit the supply to the automatic placement machine by way of automatic vibrating machines that are not shown in detail.

Figure 9:
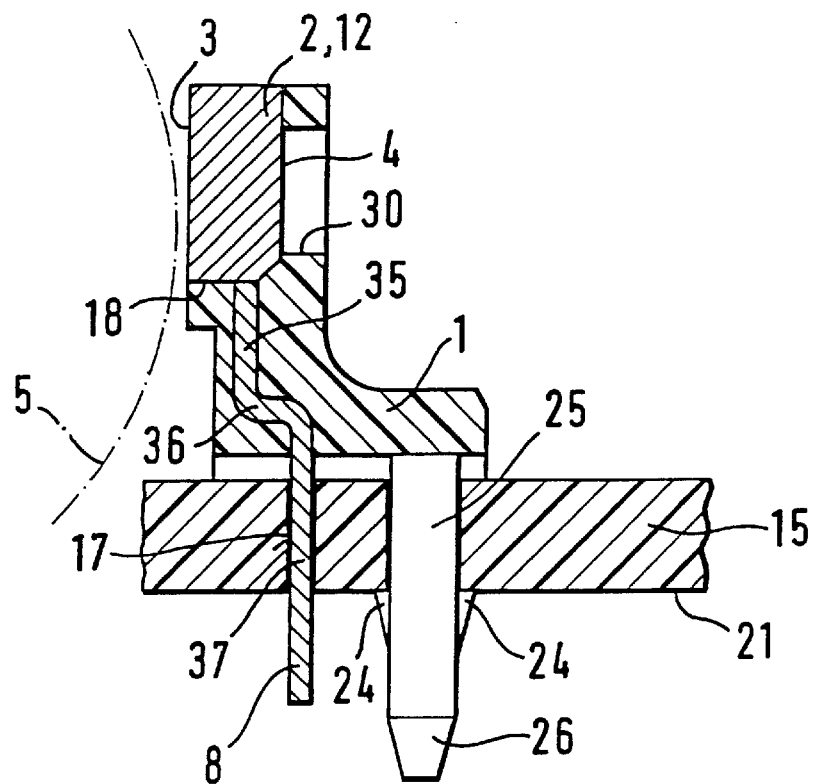
FIG. 9 is a section through the component holder with Hall sensor according to the invention along a line IX—IX in FIG. 8.
Figure 10:
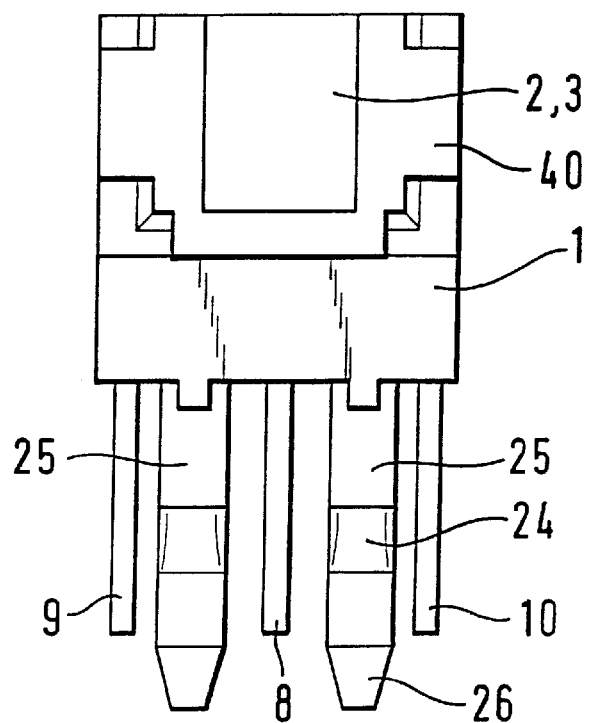
FIG. 10 is a rear view of the component holder with Hall sensor according to the invention in accordance with FIG. 7.

FIGS. 7 to 10 show a second exemplary embodiment wherein all of the parts that are the same or function in the same manner are identified with the same reference numerals of the first exemplary embodiment according to FIGS. 1 to 6. As is shown particularly clearly in FIG. 9, a section through the component holder 1 with Hall sensor 2 along a line IX—IX in a front view of the component holder 1 with Hall sensor 2 according to FIG. 8, it is also possible in addition to partially injection molding the connecting prongs 8, 9, 10 into the plastic of the component holder 1, to also injection mold regions of the housing 12 of the Hall sensor 2 along with them. As a result, a further stabilization of the Hall sensor 2 in its position in the component holder 1 can be achieved so that it is possible for there to be a particularly precise alignment of its sensor side 3, which extends essentially lateral to the surface 20 of the printed circuit board 15 and is for the most part free of plastic. A sensor side 4 of the Hall sensor 2 disposed opposite the sensor side 3 is for the most part covered with plastic, wherein an opening 30 in the plastic of the component holder 1 produces a communication of the sensor side 4 of the Hall sensor 2 with the surroundings. It is also conceivable, however, to cover the sensor side 4 of the Hall sensor 2 completely with plastic. As shown in FIG. 10, a side view of the sensor side 3 of the Hall sensor 2 that is for the most part free of plastic, this Hall sensor 2 can also be partially framed on its outer edge by a plastic rim 40 of the component holder 1.

As shown in FIG. 9, the centering pins 25, which are embodied for example as square in the second exemplary embodiment, have detent means that are formed, for example, onto two respective opposite sides of the square of the centering pin 25. The detent means is embodied, for example, in the form of a flap-like thickening 24, which tapers toward the free end 26 of the centering pin 25, and is deformed elastically inward when the centering pin 25 is inserted into the opening 16 of the printed circuit board 15 so that after the complete insertion, the thickening 24 engages in detent fashion behind an underside 21 of the printed circuit board 15 remote from the component holder 1.

It is also possible, however, with the centering pin 25 according to the first exemplary embodiment, which is embodied as cylindrical, to embody the detent means in the form of a circumferential bead 32, indicated with dashed lines in FIG. 4, which tapers toward the free end 26 of the centering pin 25 and likewise permits a securing of the component holder 1 to the printed circuit board 15 by means of detent engagement behind the underside 21 of the printed circuit board 15. However, it is also conceivable to provide differently embodied detent means, such as detent hooks or the like provided on the centering pins 25. It is naturally also possible to provide the detent means not on centering pins 25, but for example on the block-shaped part of the component holder 1.

The foregoing relates to preferred exemplary embodiments of the invention, it being understood that other variants and embodiments thereof are possible within the spirit and scope of the invention, the latter being defined by the appended claims.

We claim:

1. A component holder with a Hall sensor, said component holder is comprised of plastic as one-piece with at least one centering pin (25) for a disposition of the centering pin in at least one opening (16) of a printed circuit board, said Hall sensor (2) is mounted on said component holder (1) and comprises a housing (12) and connecting prongs (8,9, 10) for direct electrical contact with said printed circuit board (15), said Hall sensor being mounted on said component holder so that the housing (12) is adjacent the component holder and said connecting prongs protrude directly from said housing of the Hall sensor through the component holder, the component holder (1) being injection molded only onto the connecting prongs (8, 9, 10) of the Hall sensor (2) such that it cannot slide off the prongs of the Hall sensor, and wherein the housing (12) of the Hall sensor (2) is block-shaped.

2. The component holder according to claim 1, in which a first section (35) and a second section (36) of the connecting prongs (8, 9, 10) are embodied as angled one to another, said sections (35, 36) are completely enclosed by the plastic of the component holder(1).

3. The component holder according to claim 1, in which the at least one centering pin (25) has a detent means (24) which is designed so as to engage, in detent fashion with one side of the printed circuit board (15).

4. The component holder according to claim 3, in which the detent means is embodied in the form of a thickening (24) on the at least one centering pin (25) and this thickening tapers toward a free end (26) of the at least one centering pin (25).

5. A component holder for positioning a Hall sensor on a circuit board, said component holder being comprised of plastic as one-piece with at least one centering pin for a disposition of the centering pin in at least one opening (16) of a printed circuit board, said Hall sensor (2) comprises a housing (12) and connecting prongs (8,9,10) for direct electrical contact with said printed circuit board (15), said connecting prongs protrude directly from said housing of the Hall sensor, the component holder (1) being injection molded onto the connecting prongs (8, 9, 10) and at least partially onto the housing (12) of the Hall sensor (2) such that the connecting prongs extend through the component holder, and the component holder, being molder onto the prongs and part of the housing, cannot slide off from the Hall sensor (2), wherein a sensor side (3) of the Hall sensor (2) is oriented toward a rotor (5) of a motor and is free of the plastic covering of the component holder (1) and a sensor side (4) of the Hall sensor (2) which is remote from a rotor (5) of a motor is covered by the plastic of the component holder (1), and the housing (12) of the Hall sensor (2) is block-shaped.

6. The component holder according to claim 5, in which a first section (35) and a second section (36) of the connecting prongs (8, 9, 10) are embodied as angled one to another, said sections (35, 36) are completely enclosed by the plastic of the component holder(1).

7. The component holder according to claim 5, in which the at least one centering pin (25) has a detent means (24) which is designed so as to engage, in detent fashion with one side of the printed circuit board (15).

8. The component holder according to claim 7, in which the detent means is embodied in the form of a thickening (24) on the at least one centering pin (25) and this thickening tapers toward a free end (26) of the at least one centering pin (25).

* * * * *